United States Patent
Hsieh et al.

(10) Patent No.: US 7,557,740 B1
(45) Date of Patent: Jul. 7, 2009

(54) CONTEXT-BASED ADAPTIVE BINARY ARITHMETIC CODING (CABAC) DECODING APPARATUS AND DECODING METHOD THEREOF

(75) Inventors: Chao-An Hsieh, Taipei County (TW); Chi-Wang Chai, Cupertino, CA (US); Kai Wen Chuang, Yilan County (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 12/106,075

(22) Filed: Apr. 18, 2008

(51) Int. Cl.
*H03M 7/00* (2006.01)
(52) U.S. Cl. ............... 341/107; 375/242; 717/141; 382/247; 382/239
(58) Field of Classification Search ............... 341/50, 341/107; 375/242; 717/141; 382/247, 239, 382/162
See application file for complete search history.

(56) References Cited

U.S. PATENT DOCUMENTS

| | | | | |
|---|---|---|---|---|
| 7,245,242 | B2 * | 7/2007 | Hu et al. | 341/107 |
| 7,262,722 | B1 * | 8/2007 | Jahanghir et al. | 341/107 |
| 7,365,660 | B2 * | 4/2008 | Park et al. | 341/107 |
| 7,385,535 | B2 * | 6/2008 | Yang et al. | 341/107 |

* cited by examiner

*Primary Examiner*—Lam T Mai
(74) *Attorney, Agent, or Firm*—Schwegman, Lundberg & Woessner, P.A.

(57) ABSTRACT

A decoding method is adapted to be implemented using a Context-based Adaptive Binary Arithmetic Coding (CABAC) decoding apparatus, and includes: initializing a plurality of context variables; storing the context variables; performing arithmetic decoding of a syntax element according to the context variables so as to output a decoded syntax element and an update signal; and updating at least one of the context variables according to the update signal. At least one of the context variables is pre-initialized in the initializing step before a bit stream ready.

14 Claims, 4 Drawing Sheets

CONTEXT-BASED ADAPTIVE BINARY ARITHMETIC CODING (CABAC) DECODING APPARATUS AND DECODING METHOD THEREOF

BACKGROUND OF THE INVENTION

1. Field of the Invention

The invention relates to a decoding apparatus, more particularly to a Context-based Adaptive Binary Arithmetic Coding (CABAC) decoding apparatus and a decoding method thereof.

2. Description of the Related Art

H.264/AVC is a recently developed video signal compression standard, which employs advanced encoding techniques to provide superior compression efficiency compared to other existing video signal compression standards such as MPEG-1, MPEG-2, H.263, etc.

H.264/AVC adopts Context-based Adaptive Variable Length Coding (CAVLC) technology or CABAC technology for entropy encoding to increase the coding efficiency. While the coding efficiency of CABAC technology is about 10% higher than that of CAVLC technology, encoding/decoding calculations in CABAC are more complex than those in CAVLC. During the CABAC decoding process, an input bit stream must at least go through an initialization step and an arithmetic decoding step before the decoding procedure can be completed. The total amount of time required by the initialization step and the arithmetic decoding step, which is actually relatively long, has a critical affect on the efficiency of a decoding system. As such, it is highly desired to reduce latency during the CABAC decoding process so as to improve the overall efficiency of the decoding system.

SUMMARY OF THE INVENTION

Therefore, an object of the present invention is to provide a CABAC decoding apparatus and a decoding method thereof that can improve the overall efficiency of a decoding system.

According to one aspect of the present invention, there is provided a CABAC decoding apparatus that comprises: an initialization module for initializing a plurality of context variables; a storage module coupled to the initialization module for storing the context variables; an arithmetic decoding module coupled to the storage module for performing arithmetic decoding of a syntax element according to the context variables, so as to output a decoded syntax element and an update signal; and an update module coupled to the arithmetic decoding module and the storage module for updating at least one of the context variables in the storage module according to the update signal received from the arithmetic decoding module. The initialization module pre-initializes at least one of the context variables before a macro-block level bit stream is ready.

According to another aspect of the present invention, there is provided a decoding method adapted to be implemented using a CABAC decoding apparatus and comprising: initializing a plurality of context variables; storing the context variables; performing arithmetic decoding of a syntax element according to the context variables so as to output a decoded syntax element and an update signal; and updating at least one of the context variables according to the update signal. At least one of the context variables is pre-initialized in the initializing step before a macro-block level bit stream is ready.

Since the context variables are calculated beforehand by the initialization module and are stored in the storage module, in case of a bit stream ready and arithmetic decoding is to be performed, the arithmetic decoding module can directly retrieve corresponding ones of the context variables from the storage module and does not have to wait for initialization of the required context variables. As a result, latency during the CABAC decoding process can be reduced, and the overall efficiency of a decoding system is increased.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
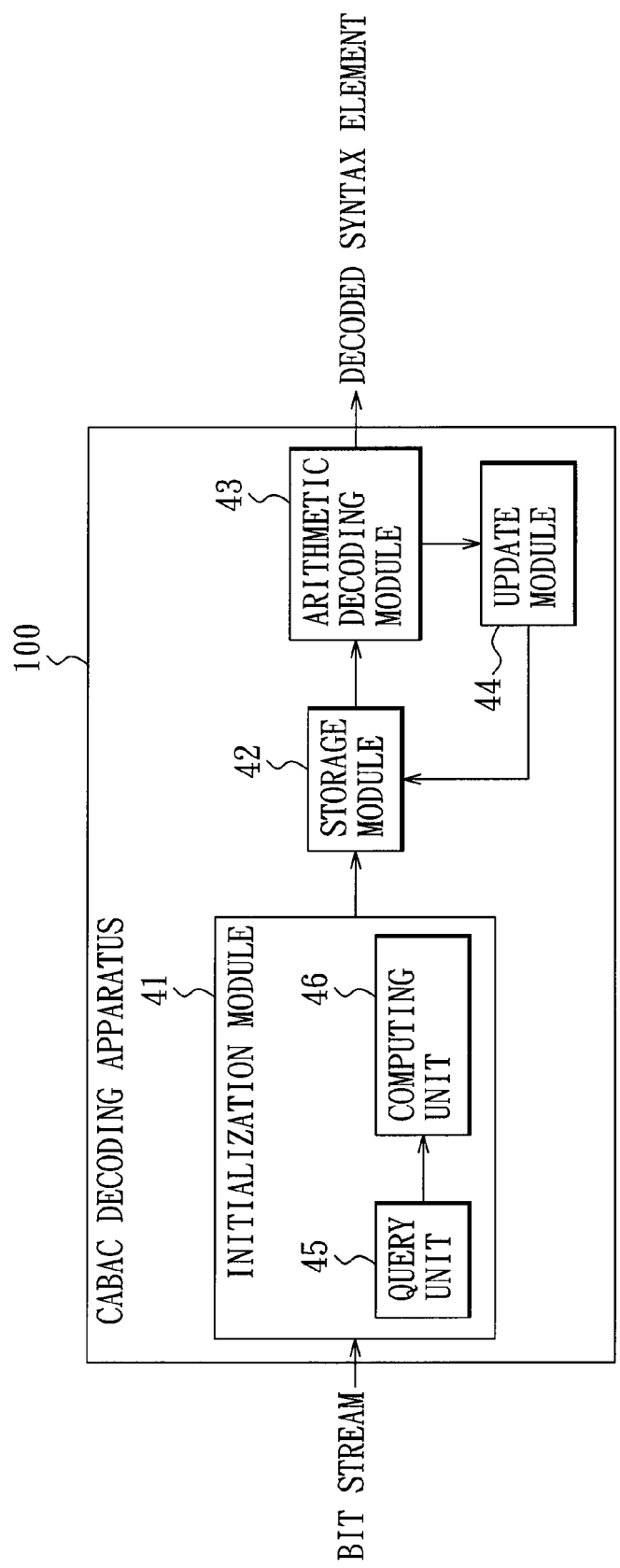
FIG. 1 is a block diagram of the preferred embodiment of a CABAC decoding apparatus according to the present invention.

Referring to FIG. 1, the preferred embodiment of a CABAC decoding apparatus 100 according to the present invention is shown to include an initialization module 41, a storage module 42, an arithmetic decoding module 43 and an update module 44. The initialization module 41 is for initializing a plurality of context variables. The storage module 42 is coupled to the initialization module 41 for storing the context variables. The arithmetic decoding module 43 is coupled to the storage module 42 for performing arithmetic decoding (i.e., binary arithmetic decoding) of a syntax element according to the context variables in the storage module 42, so as to output a decoded syntax element and an update signal. For instance, when the CABAC decoding apparatus 100 decodes a first syntax element, the arithmetic decoding module 43 retrieves the context variables needed for decoding the first syntax element from the storage module 42, decodes the first syntax element, and outputs the update signal to the update module 44. Thereafter, the update module 44, which is coupled to the arithmetic decoding module 43 and the storage module 42, updates dynamically the context variables in the storage module 42 according to the update signal received from the arithmetic decoding module 43. Moreover, the initialization module 41 pre-initializes the context variables before a bit stream ready, such as a macro-block level bit stream ready, so that, in case of a bit stream ready and arithmetic decoding is to be performed, the arithmetic decoding module 43 can directly retrieve corresponding ones of the context variables from the storage module 42, thereby reducing latency during the CABAC decoding process.

The initialization module 41 according to an embodiment of this invention includes a query unit 45 and a computing unit 46 coupled to the query unit 45. The query unit 45 looks up a predetermined lookup table according to an index value (cabac_init_idc) so as to output an initial parameter set (m, n). Then, the computing unit 46 computes the initial parameter set (m, n) and a slice quantization parameter (SliceQPy) so as to output the context variables. According to an embodiment of this invention, each of the context variables includes a probability state index (pstateIdx) and a value of the most probable symbol (valMPS). Furthermore, the initialization module 41 can initialize the context variables according to a predetermined sequence. For instance, the context variables are initialized according to sequence of slice types, i.e., I-slice, P-slice and B-slice. However, it should be noted that the predetermined sequence is not limited to what is disclosed herein. As for the above-mentioned parameters, such as the index value (cabac_init_idc), the initial parameter set (m, n), the slice quantization parameter (SliceQPy), the probability state index (pstateIdx), the value of the most probable symbol (valMPS), and the slice type, the definitions thereof can be found in ISO/IEC 14496-10 and will not be detailed herein for the sake of brevity.

Figure 2:
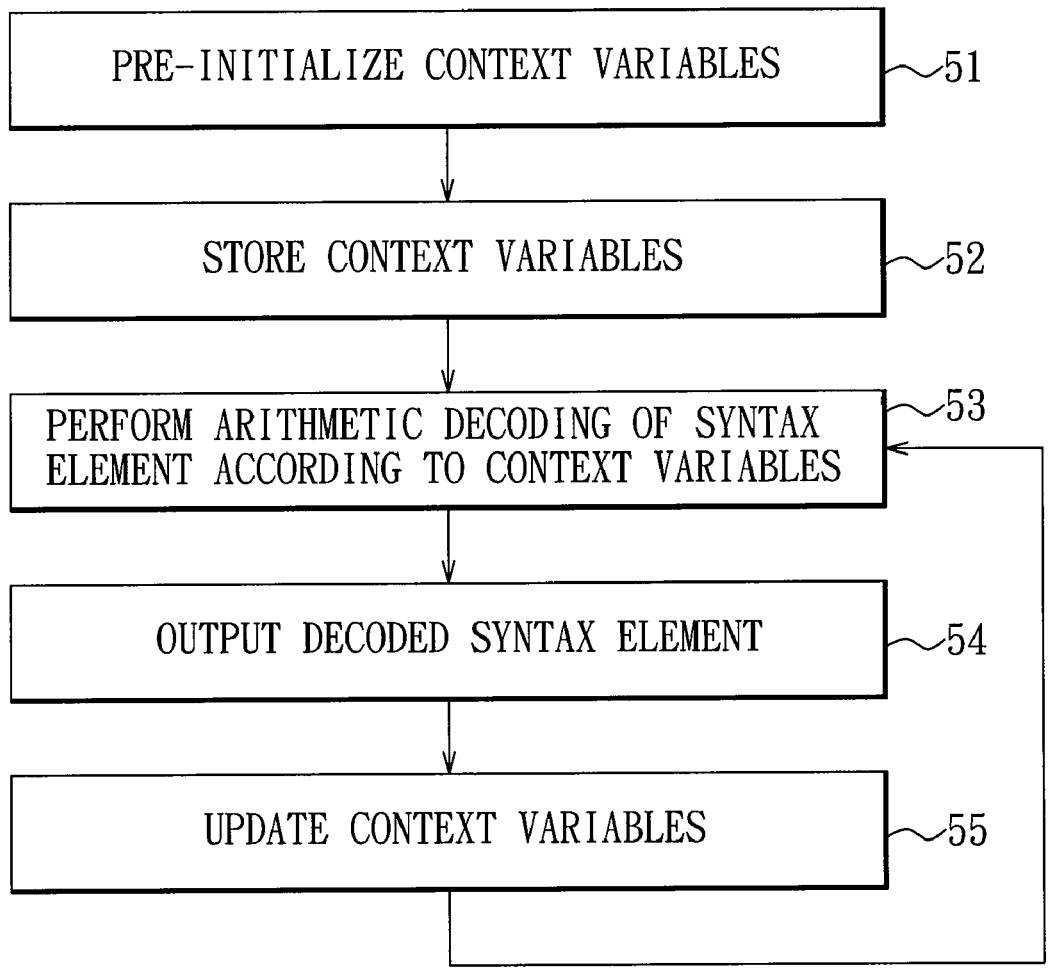
FIG. 2 is a flowchart of the preferred embodiment of a CABAC decoding method according to the present invention.

With further reference to FIG. 2, the preferred embodiment of a CABAC decoding method according to the present invention is shown to comprise:

step 51: initializing a plurality of context variables;
step 52: storing the context variables;
step 53: performing arithmetic decoding of a syntax element according to the context variables;
step 54: outputting a decoded syntax element; and
Step 55: updating the context variables.

In the decoding method, first, in step 51, the initialization module 41 pre-initializes the context variables according to a predetermined sequence before a bit stream ready. Then, in step 52, the context variables are stored in the storage module 42. Subsequently, in case of a bit stream ready and arithmetic decoding is to be performed, the arithmetic decoding module 43 can directly retrieve from the storage module 42 the context variables that are needed for decoding the syntax element, performs arithmetic decoding (step 53), and outputs the decoded syntax element (step 54) and an update signal. Finally, in step 55, the update module 44 updates the context variables according to the update signal.

Figure 3A:
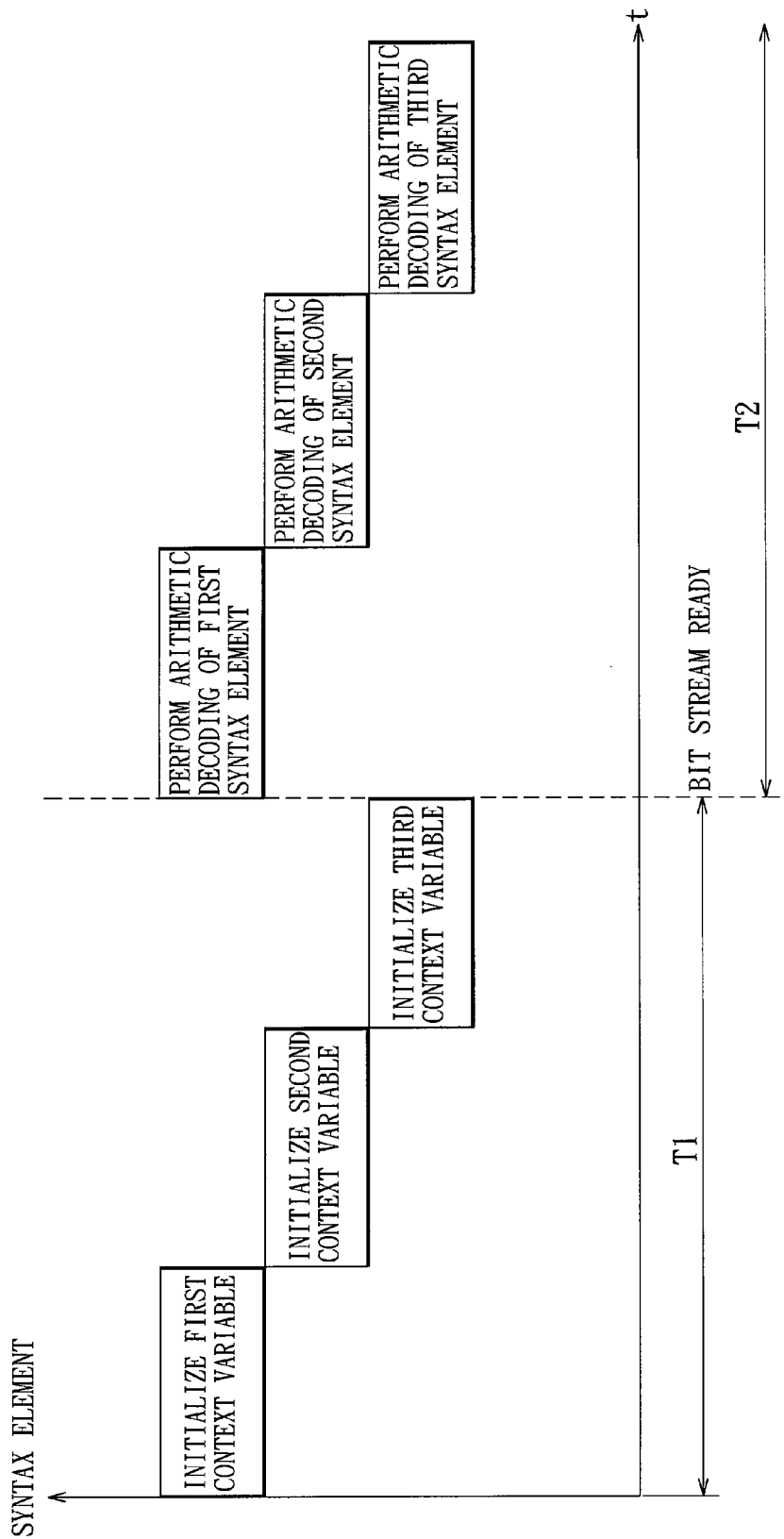
FIGS. 3a and 3b are signal timing diagrams of the CABAC decoding apparatus of the preferred embodiment.
Figure 3B:
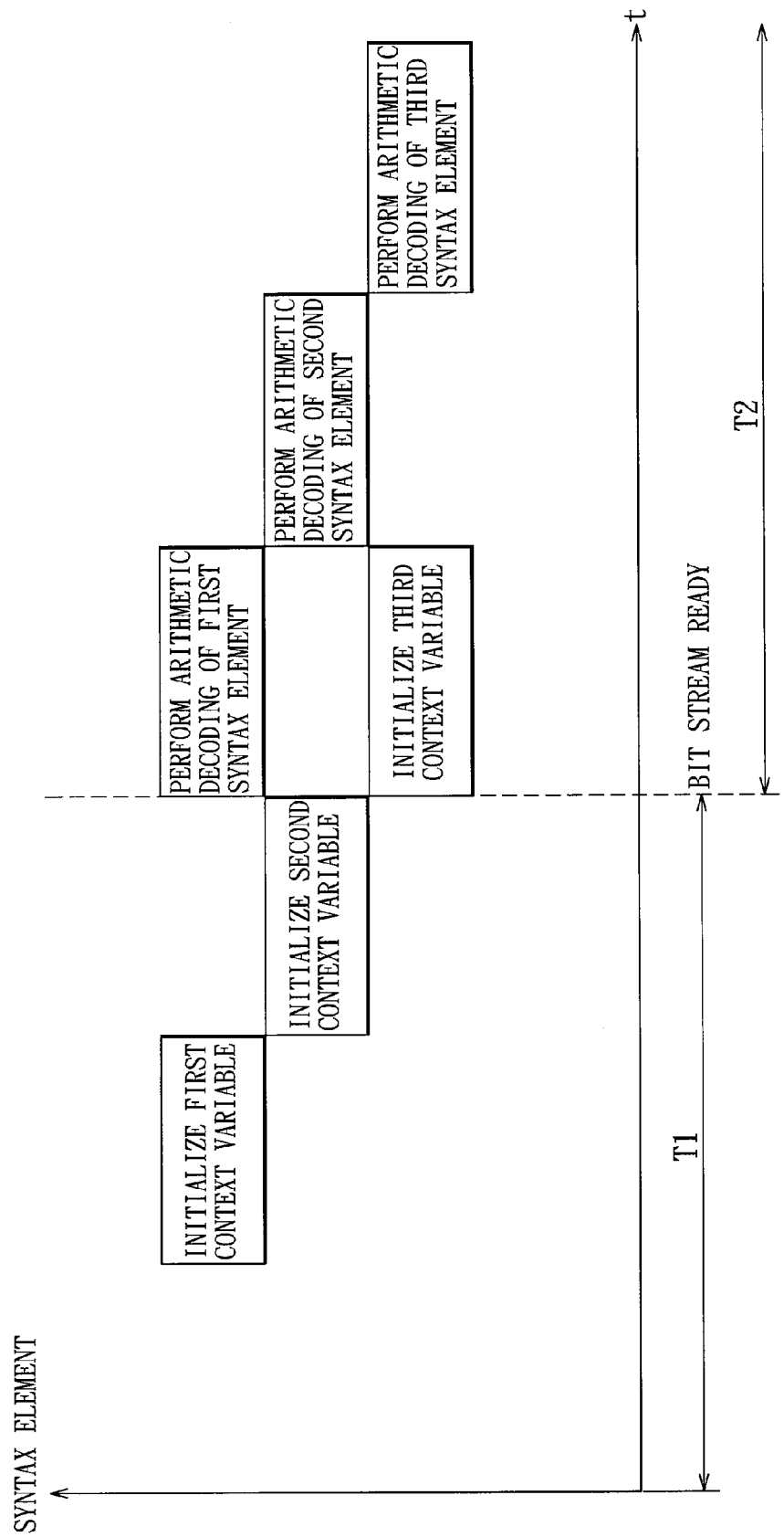

Referring to FIGS. 1, 3a and 3b, it is assumed that there are first, second and third syntax elements that require decoding by the CABAC decoding apparatus 100. As shown in FIG. 3a, before a bit stream ready, the initialization module 41 performs initialization operations beforehand to initialize first, second and third context variables. Thereafter, in case of a bit stream ready, the arithmetic decoding module 43 can directly perform arithmetic decoding operations for the first, second and third syntax elements. In such a manner, while the overall time period originally required in the CABAC decoding process is (T1+T2), through the mechanism of the present invention, by conducting the initialization step beforehand, the overall time period of actual decoding of each syntax element is only (T2), such that overall efficiency is significantly enhanced during the decoding procedure of a H.264/AVC system. Moreover, it should be noted herein that the initialization module 41 is not limited to initializing all of the context variables before a bit stream ready. As shown in FIG. 3b, a non-initialized part of the context variables may be initialized after a bit stream ready. Since the CABAC decoding apparatus 100 of this invention includes the storage module 42 disposed between the initialization module 41 and the arithmetic decoding module 43, the CABAC decoding apparatus 100 is similar to a pipelined framework. Therefore, as long as the initialization module 41 initializes the context variables according to a predetermined sequence, while the initialization module 41 continues to perform initialization, the context variables needed by the arithmetic decoding module 43 are already stored in the storage module 42 so that arithmetic decoding can be performed simultaneously, thereby reducing further the time period (T3, T3<T1) needed for initialization to improve the efficiency further.

Moreover, while the CABAC decoding apparatus and method are exemplified in the preferred embodiment as being applied to a H.264/AVC decoder, it should be apparent to those skilled in the art that the invention is also applicable to devices or other decoders that employ CABAC technology, and should not be limited to what is disclosed herein.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A Context-based Adaptive Binary Arithmetic Coding (CABAC) decoding apparatus, comprising:
   an initialization module for initializing a plurality of context variables;
   a storage module coupled to said initialization module for storing the context variables;
   an arithmetic decoding module coupled to said storage module for performing arithmetic decoding of a syntax element according to the context variables, so as to output a decoded syntax element and an update signal; and
   an update module coupled to said arithmetic decoding module and said storage module for updating at least one of the context variables in said storage module according to the update signal received from said arithmetic decoding module;
   wherein said initialization module pre-initializes at least one of the context variables before a bit stream ready.

2. The CABAC decoding apparatus as claimed in claim 1, wherein said initialization module includes:
   a query unit for looking up a predetermined lookup table according to an index value so as to output an initial parameter set; and
   a computing unit coupled to said query unit for computing the initial parameter set and a slice quantization parameter so as to output the context variables.

3. The CABAC decoding apparatus as claimed in claim 1, wherein each of the context variables includes a probability state index and a value of the most probable symbol.

4. The CABAC decoding apparatus as claimed in claim 1, wherein said initialization module initializes each of the context variables according to a predetermined sequence.

5. The CABAC decoding apparatus as claimed in claim 4, wherein the predetermined sequence is determined according to a slice type.

6. The CABAC decoding apparatus as claimed in claim 5, wherein the slice type is one of an I-slice, a P-slice and a B-slice.

7. The CABAC decoding apparatus as claimed in claim 1, wherein said CABAC decoding apparatus is adapted for application to a H.264/AVC system.

8. A decoding method adapted to be implemented using a Context-based Adaptive Binary Arithmetic Coding (CABAC) decoding apparatus, said decoding method comprising:
   initializing a plurality of context variables;
   storing the context variables;
   performing arithmetic decoding of a syntax element according to the context variables so as to output a decoded syntax element and an update signal; and
   updating at least one of the context variables according to the update signal;
   wherein at least one of the context variables is pre-initialized in said initializing step before a bit stream ready.

9. The decoding method as claimed in claim 8, wherein said initializing step includes:

looking up a predetermined lookup table according to an index value so as to output an initial parameter set; and computing the initial parameter set and a slice quantization parameter so as to output the context variables.

10. The decoding method as claimed in claim 8, wherein each of the context variables includes a probability state index and a value of the most probable symbol.

11. The decoding method as claimed in claim 8, wherein each of the context variables is initialized in said initializing step according to a predetermined sequence.

12. The decoding method as claimed in claim 11, wherein the predetermined sequence is determined according to a slice type.

13. The decoding method as claimed in claim 12, wherein the slice type is one of an I-slice, a P-slice and a B-slice.

14. The decoding method as claimed in claim 13, wherein said decoding method is adapted for application to a H.264/AVC system.

* * * * *